United States Patent
Matsuda

(10) Patent No.: US 10,707,884 B2
(45) Date of Patent: Jul. 7, 2020

(54) ATOMIC OSCILLATOR AND ELECTRONIC APPARATUS

(71) Applicant: Murata Manufacturing Co., Ltd., Nagaokakyo-shi, Kyoto-fu (JP)

(72) Inventor: Kenji Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/274,291

(22) Filed: Feb. 13, 2019

(65) Prior Publication Data

US 2019/0181871 A1 Jun. 13, 2019

Related U.S. Application Data

(63) Continuation of application No. PCT/JP2017/027678, filed on Jul. 31, 2017.

(30) Foreign Application Priority Data

Nov. 22, 2016 (JP) .................. 2016-226800

(51) Int. Cl.
*H03L 7/26* (2006.01)
*G04F 5/14* (2006.01)
*H01S 1/06* (2006.01)

(52) U.S. Cl.
CPC .................. *H03L 7/26* (2013.01); *G04F 5/14* (2013.01); *G04F 5/145* (2013.01); *H01S 1/06* (2013.01)

(58) Field of Classification Search
CPC ... G04F 5/145; G04F 5/14; H03L 7/26; H03B 17/00
See application file for complete search history.

(56) References Cited

U.S. PATENT DOCUMENTS

| 5,670,914 A * | 9/1997 | Liberman ................. H03L 7/26 331/94.1 |
| 9,507,322 B2 * | 11/2016 | Hashi ...................... G04F 5/145 |
| 9,654,125 B2 * | 5/2017 | Nakajima ................. H03L 7/26 |
| 2015/0084707 A1 | 3/2015 | Maki |
| 2015/0369427 A1 | 12/2015 | Nagasaka |
| 2015/0378316 A1 * | 12/2015 | Parsa ....................... G04F 5/14 250/573 |
| 2016/0126965 A1 | 5/2016 | Hashi |

FOREIGN PATENT DOCUMENTS

| JP | H11512876 A | * 11/1999 |
| JP | 2009-302706 A | 12/2009 |
| JP | 2013150334 A | * 8/2013 |
| JP | 2013-239611 A | 11/2013 |
| JP | 2015-070331 A | 4/2015 |
| JP | 2016-008836 A | 1/2016 |
| JP | 2016-092442 A | 5/2016 |

OTHER PUBLICATIONS

Official Communication issued in International Patent Application No. PCT/JP2017/027678, dated Oct. 17, 2017.

* cited by examiner

*Primary Examiner* — Ryan Johnson
(74) *Attorney, Agent, or Firm* — Keating & Bennett, LLP

(57) ABSTRACT

An atomic oscillator including a light source, a gas cell including an internal space in which alkali metal atoms are encapsulated, and a light detector that detects light which has emitted from the light source and has passed through the gas cell. The alkali metal atoms encapsulated in the internal space are adhered, in a liquid state or a solid state, to at least an incident window, such that light incident on the incident window is reduced.

20 Claims, 10 Drawing Sheets

ATOMIC OSCILLATOR AND ELECTRONIC APPARATUS

CROSS REFERENCE TO RELATED APPLICATIONS

This application claims the benefit of priority to Japanese Patent Application No. 2016-226800 filed on Nov. 22, 2016 and is a Continuation Application of PCT Application No. PCT/JP2017/027678 filed on Jul. 31, 2017. The entire contents of each application are hereby incorporated herein by reference.

BACKGROUND OF THE INVENTION

1. Field of the Invention

The present invention relates to an atomic oscillator and an electronic apparatus including the atomic oscillator.

2. Description of the Related Art

An atomic oscillator is able to obtain a resonant frequency using CPT (Coherent Population Trapping) by irradiating a gas cell in which atoms of rubidium, cesium, or the like are hermetically encapsulated with two types of laser light beams having different wavelengths. It has been known that the atoms in the gas cell absorb the laser light beams and a light absorption characteristic (transmittance) varies according to differences in frequency between the two types of light beams. In particular, the atomic oscillator detects, as an EIT (Electromagnetically Induced Transparency) signal, a spectrum of transmitted light which is not absorbed by the atoms and passes through them using the phenomenon (EIT) that both of the two types of light beams are not absorbed but pass therethrough. The specific configuration of the atomic oscillator is disclosed in, for example, Japanese Unexamined Patent Application Publication No. 2013-239611.

In the atomic oscillator disclosed in Japanese Unexamined Patent Application Publication No. 2013-239611, a neutral density filter (ND filter) is provided between a semiconductor laser serving as a light source and a gas cell. The neutral density filter transmits only a portion of emitted light from the semiconductor laser, and the light that has passed through the neutral density filter is incident on the gas cell. In general, when the semiconductor laser is used for the atomic oscillator, light having a light intensity of equal to or higher than that required to obtain an optimum EIT signal is incident on the gas cell, and the neutral density filter for adjusting the light incident on the gas cell is therefore an essential component.

However, in the atomic oscillator disclosed in Japanese Unexamined Patent Application Publication No. 2013-239611, it is necessary to provide the neutral density filter between the light source and the gas cell, and there is, therefore, a problem that the number of components is increased. Further, even when the neutral density filter is used for the atomic oscillator, a neutral density filter having a high dimming characteristic is required in order to reduce the light intensity to that required to obtain the optimal EIT signal only by the neutral density filter. In particular, in the case in which an absorption type is adopted as the neutral density filter, a thick neutral density filter is required to obtain a high dimming characteristic because the dimming characteristic is dependent on the thickness of the filter. As a result, the atomic oscillator disclosed in Japanese Unexamined Patent Application Publication No. 2013-239611 has a problem in that the neutral density filter cannot be reduced in size.

SUMMARY OF THE INVENTION

Preferred embodiments of the present invention provide atomic oscillators that each eliminate the need for a neutral density filter itself or at least eliminate the need for a neutral density filter having a high dimming characteristic, and electronic apparatuses each including such an atomic oscillator.

An atomic oscillator according to a preferred embodiment of the present invention includes a light source, a gas cell including an internal space in which alkali metal atoms are encapsulated, and a light detector that detects light which has been emitted from the light source and has passed through the gas cell, wherein the gas cell includes an incident window through which the light from the light source is incident, an emission window through which the light is emitted to the light detector, and a side wall supporting the incident window and the emission window, and the light incident on the incident window is reduced by adhering the alkali metal atoms encapsulated in the internal space, in a liquid state or a solid state, to at least the incident window.

An electronic apparatus according to a preferred embodiment of the present invention includes the atomic oscillator described above.

According to preferred embodiments of the present invention, by adhering the alkali metal atoms encapsulated in the internal space, in the liquid state or the solid state, to at least the incident window, the light incident on the incident window is reduced. Therefore, it is possible to eliminate the need for a neutral density filter itself or to eliminate at least the need for a neutral density filter having a high dimming characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
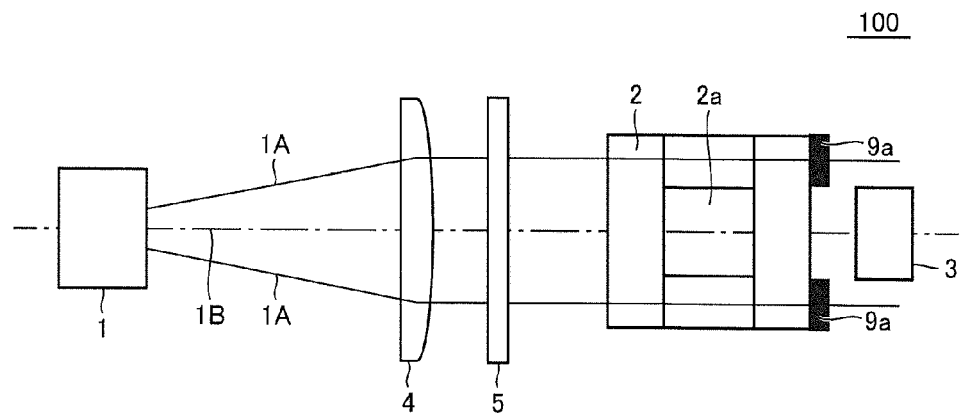
FIG. 1 is a schematic diagram for explaining the configuration of an atomic oscillator according to a first preferred embodiment of the present invention.

Hereinafter, atomic oscillators according to preferred embodiments of the present invention will be described in detail with reference to the accompanying drawings. In the drawings, the same reference numerals denote the same or equivalent components and elements.

First Preferred Embodiment

Hereinafter, an atomic oscillator according to a first preferred embodiment of the present invention will be described with reference to the accompanying drawings. FIG. 1 is a schematic diagram for explaining the configuration of an atomic oscillator 100 according to the first preferred embodiment of the present invention. FIG. 1 illustrates quantum portions for a light source to a light detector 3 in the configuration of the atomic oscillator 100. In addition to the quantum portions, the atomic oscillator 100 includes configurations of a light source wavelength control circuit 7 and a frequency control circuit 8 (see FIG. 2), which will be described later, and configurations of a crystal oscillator which is not illustrated in the drawing and defines and functions as a signal source, a feedback circuit which feeds back output signals from the quantum portions to the crystal oscillator, and other components and elements. In this specification, the quantum portions of the atomic oscillator will be described in order to simplify the description. In the following description, the quantum portions of the atomic oscillator may be simply referred to as the atomic oscillator.

The atomic oscillator 100 illustrated in FIG. 1 includes the light source 1, the gas cell 2, the light detector 3, an optical member 4, a wavelength plate 5, and a heater 9a. In the atomic oscillator 100, light 1A from the light source 1 is incident on the gas cell 2 after passing through the optical member 4 and the wavelength plate 5, and the light detector 3 detects the light that has passed through the gas cell 2 to obtain an EIT signal.

Figure 2:
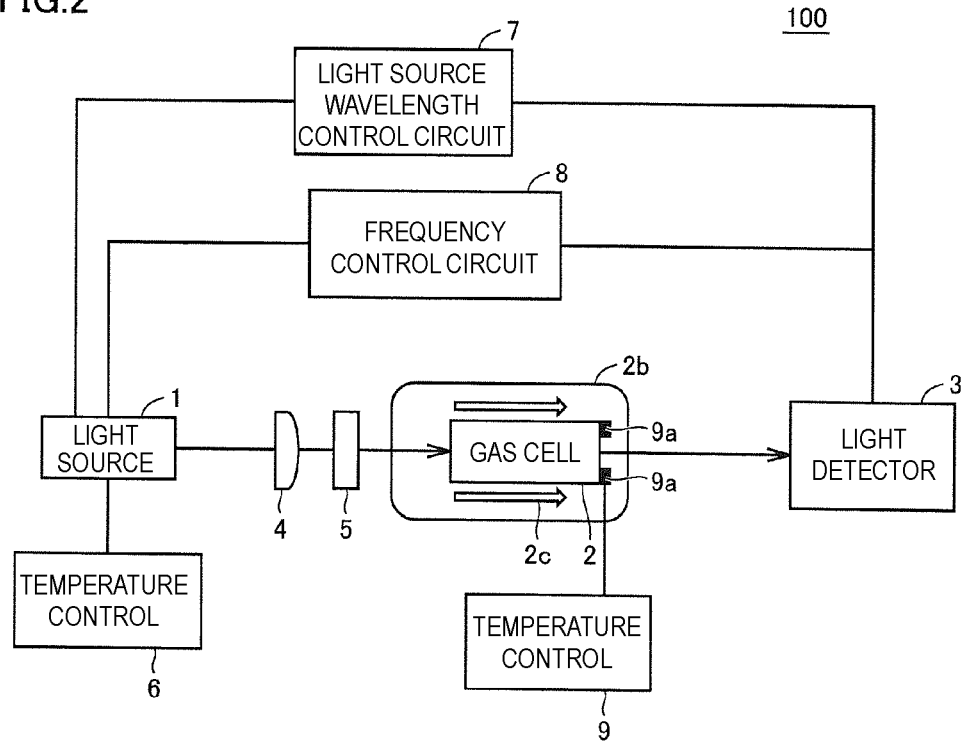
FIG. 2 is a block diagram for explaining functions of the atomic oscillator according to the first preferred embodiment of the present invention.

FIG. 2 is a block diagram for explaining functions of the atomic oscillator 100 according to the first preferred embodiment of the present invention. The atomic oscillator 100 illustrated in FIG. 2 also includes temperature control circuits 6 and 9, the light source wavelength control circuit 7, and the frequency control circuit 8 which are necessary for driving, in addition to the configurations of the quantum portions of the atomic oscillator 100, which are illustrated in FIG. 1.

Further, the components of the atomic oscillator 100 illustrated in FIG. 1 and FIG. 2 will be described in detail. For example, a single mode VCSEL (Vertical Cavity Surface Emitting Laser) is preferably used as the light source 1. Specifically, a VCSEL of Cs-D1 line having a light wavelength of about 894.6 nm is preferably used for the light source 1. Alternatively, a VCSEL of Cs-D2 line having a light wavelength of about 852.3 nm, a VCSEL of Rb-D1 line of about 795.0 nm, a VCSEL of Rb-D2 line of about 780.2 nm, or other suitable light source, for example, may be used for the light source 1. The light source 1 is not limited to the VCSEL, and a DFB (Distributed Feedback) laser, a DBR (Distributed Bragg Reflector) laser, or other suitable light source, for example, may be used therefor.

When the VCSEL is used for the light source 1, the wavelength of the light varies due to individual differences of the VCSEL. Therefore, the temperature control circuit 6 is used to adjust the light such that light having a wavelength of about 894.6 nm is able to be output. The temperature control circuit 6 adjusts a temperature by a heater provided on the light source 1 based on a temperature measured by a thermistor or a thermocouple provided in the vicinity of the light source 1. If the atomic oscillator 100 is used for an atomic clock, the temperature control circuit 6 preferably adjusts the light source 1 in a temperature range of about 30° C. to about 125° C., for example. Note that the temperature control circuit 6 adjusts the temperature of the light source 1 while measuring the temperature using a sensor (not illustrated) such as, for example, the thermistor or the thermocouple, which is disposed in the vicinity of the light source 1.

As a method of controlling the wavelength of the light that is output from the VCSEL, there is also a method in which an operating current is adjusted other than the adjustment of the temperature. For the light source 1 that is used in the atomic oscillator 100 for CSAC (Chip-Scale Atomic Clock) application, a VCSEL having an operating current of about 0.8 mA to about 2 mA, for example, is preferably used. For the light source 1 according to the first preferred embodiment, experiments are performed while the operating temperature of the VCSEL is set to about 76.9° C. and the operating current (DC current value) is set to about 1.1 mA. The VCSEL of the light source 1 has a bias tee at its input side, and a signal obtained by synthesizing a DC current and an RF signal of about 4.596315885 GHz by the bias tee is input to the input side. Therefore, the VCSEL of the light source 1 creates, as first-order sideband components, two light beams having a difference of about 9.192631770 GHz, which is a transition frequency of Cs, by frequency modulation. Since an optimum value of a signal intensity of the RF signal varies depending on a wiring to the VCSEL, an impedance of the VCSEL itself, the DC current, and the operating temperature, the value differs greatly depending on the measurement systems. In the light source 1 according to the first preferred embodiment, the signal intensity of the EIT signal (difference between the signal intensity at the peak and the signal intensity at the bottom) is adjusted to be maximum. The condition that the signal intensity of the EIT signal is maximum corresponds to the frequency modulation with which the intensity of the first-order sideband components of the light beams from the VCSEL is maximized. When the VCSEL is subject to the frequency modulation, a carrier component and components of second-order and higher-order modes are generated in addition to the first-order sideband. These components however become noise factors, so that it is preferable to reduce or prevent the components other than the first-order sideband as much as possible.

In the atomic oscillator 100, the optical member 4, such as a lens, for example, is disposed between the light source 1 and the gas cell 2. The optical member 4 is used to adjust the shape of the light incident on the gas cell 2, converting diffused light emitted from the light source 1 into parallel (collimated) light, or changing a spot diameter. For the optical member 4 according to the first preferred embodiment, a collimator lens is preferably used so as to have the spot diameter of about 2 mm, for example. A general definition is used that the spot diameter of the light source 1 is in a range in which the light intensity is about $1/e^2$ relative to the light intensity of the peak. In the atomic oscillator 100, the light converted into the parallel light by the optical member 4 passes through the gas cell 2 and reaches the light detector 3.

Further, in the atomic oscillator 100, the wavelength plate 5 is disposed between the light source 1 and the gas cell 2. The wavelength plate 5 is used to change polarization of the light from the light source 1. The light emitted from the light source 1 is generally linearly polarized light. Frequency fluctuations tend to occur in the EIT signal using the linearly polarized light because energy levels that fluctuate greatly with external magnetic fields are used. For this reason, the atomic oscillator commonly uses levels with small frequency fluctuations with the external magnetic fields, and the linearly polarized light from the light source 1 is therefore converted into circularly polarized light by the wavelength plate 5 and the light after the conversion is incident on the gas cell 2. In the wavelength plate 5 according to the first preferred embodiment, a wavelength plate is disposed such that clockwise circularly polarized light is obtained. Note that the circularly polarized light incident on the gas cell 2 may be clockwise circularly polarized light or counterclockwise circularly polarized light.

The gas cell 2 is a hermetically encapsulated container in which alkali metal gas (atoms), such as K, Na, Cs, or Rb, for example, is hermetically encapsulated. The gas cell 2 includes an incident window (incident side) through which the light is incident at an end closer to the light source 1, an emission window (emitting side) through which the light is emitted at a distal end farther from the light source 1, and a side wall (side surface) that supports the incident window and the emission window. In the gas cell of the atomic oscillator, the alkali metal gas of Cs and Rb, for example, is preferably hermetically encapsulated. When the size of the gas cell 2 is equal to or smaller than about 10 mm, the temperature control circuit 9 adjusts the heater 9a to warm the gas cell 2 in order to increase the amount of the alkali metal gas in the internal space 2a. For example, if the gas cell is used for the atomic oscillator, a use temperature is preferably about 30° C. to about 125° C., for example. The temperature control circuit 9 adjusts the temperature by the heater provided on the gas cell 2 based on a temperature measured by a thermistor or a thermocouple provided in the vicinity of the gas cell 2.

The amount of the alkali metal gas required in the gas cell 2 is an amount at a saturated vapor pressure thereof. However, since the alkali metal gas is gradually consumed by, for example, reaction with the container of the gas cell 2, the alkali metal gas the amount of which is larger than the amount at the saturated vapor pressure is therefore encapsulated in the gas cell 2. Specifically, when the gas cell has a length of one side of about several millimeters, about several micrograms of the alkali metal gas are encapsulated in the gas cell 2. It should be noted that the encapsulated alkali metal atoms for which the amount is larger than the amount at the saturated vapor pressure remain in the internal space 2a in a solid or liquid state.

Figure 3:
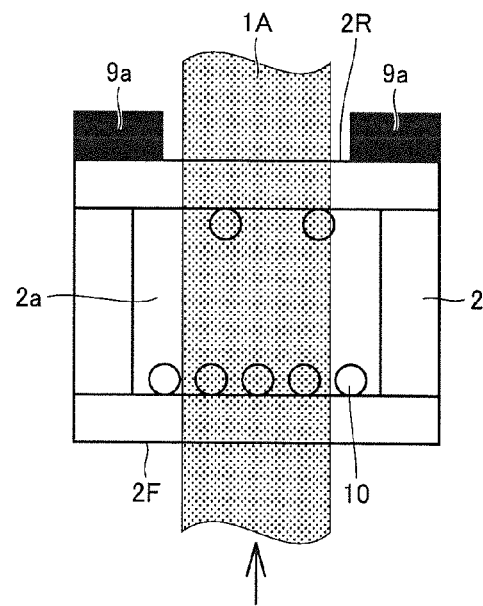
FIG. 3 is a diagram for explaining a gas cell according to the first preferred embodiment of the present invention.

Further, in the gas cell 2 according to the first preferred embodiment, the alkali metal atoms in the solid or liquid state, which remain in the interior space 2a, are collected and adhered to the incident window using the heater 9a. Specifically, by utilizing a property that the alkali metal atoms gather in a region with a relatively low temperature in the solid or liquid state, the alkali metal atoms are collected and adhered to the incident window by heating the emission window by the heater 9a provided on the emission window of the gas cell 2 to cause the temperature of the incident window to be lower than that of the emission window. FIG. 3 is a diagram for explaining the gas cell according to the first preferred embodiment of the present invention. In the gas cell 2 illustrated in FIG. 3, the heater 9a is provided at a position on an emission window 2R at which the light 1A emitted from the light source 1 is not blocked. Specifically, the heater 9a is provided in a peripheral portion of an optical axis of the light 1A on the emission window 2R. The gas cell 2 causes a temperature gradient such that the temperature of an incident window 2F is lower than that of the emission window 2R to be generated in the internal space 2a by heating the gas cell 2 with the heater 9a. Therefore, the saturated vapor pressure at the incident window 2F side becomes lower than that at the emission window 2R side, and a large amount of the alkali metal atoms 10 in the solid or liquid state are collected on the incident window 2F. In other words, the vaporized alkali metal atoms 10 are cooled to be aggregated at the incident window 2F side, which has a lower temperature than the emission window 2R, and are in the solid or liquid state. It should be noted that the heater 9a normally heats the gas cell 2 to a high temperature in order to secure the atom quantity of the alkali metal gas encapsulated in the gas cell 2. Moreover, in the first preferred embodiment, the heater 9a is also used to collect the alkali metal atoms 10 in the solid or liquid state on the incident window 2F. A heater to secure the atom quantity of the alkali metal gas and a heater to collect the alkali metal atoms 10 in the solid or liquid state on the incident window 2F may be separately provided on the gas cell 2.

In conventional atomic oscillators, a gas cell has been designed so as not to disturb the light from the light source to the light detector 3 such that the alkali metal atoms in the solid or liquid state are not collected on an optical path. However, in the gas cell 2 according to the first preferred embodiment, the alkali metal atoms 10 in the solid or liquid state, which have been collected on the incident window 2F, are used as a neutral density filter by utilizing the characteristic that the alkali metal atoms in the solid or liquid state reduce light. In other words, in the atomic oscillator 100 according to the first preferred embodiment, instead of the neutral density filter which attenuates the intensity of the light from the light source 1, the alkali metal atoms 10 in the solid or liquid state, which have been collected on the incident window 2F of the gas cell 2 illustrated in FIG. 3, are used as the neutral density filter.

The gas cell 2 is preferably transparent at least on the optical path in order to allow the light from the light source 1 to be incident thereon. For this reason, glass, such as quartz glass, borosilicate glass, and aluminosilicate glass, for example, is preferably used for the incident/emission windows of the gas cell 2. Glass or Si, for example, which is able to be anodically bonded to glass is preferably used for the side surface of the gas cell 2. A member that is used for the gas cell 2 preferably has high transmittance, which transmits the light from the light source 1 as much as possible, and an anti-reflection process such as AR coating, for example, may be performed thereon.

It is possible to obtain a preferable EIT signal when the container size of the gas cell 2 is larger in both of the direction of the optical axis and the direction perpendicular or substantially perpendicular to the optical axis. This is because a region at which the light is applied to the alkali metal gas in the gas cell 2 is enlarged and a time period during which the light is applied to the alkali metal gas is increased. However, the atomic oscillator is preferably reduced in size, and the container size of the gas cell is preferably set such that the length of one side thereof is about 1 mm to about 10 mm, for example.

In addition to the alkali metal gas, buffer gas is encapsulated in the gas cell 2. In a case in which only the alkali metal gas is encapsulated in the gas cell, there is a problem that the alkali metal atoms collide with the wall surface of the container in a short time and a period of time for observation is shortened. Therefore, inert gas called buffer gas is encapsulated in the gas cell together with the alkali metal gas in order to extend the period of time for observation. Thus, a period of time until the alkali metal gas collides with the wall surface of the container is increased by causing the alkali metal gas to collide with the buffer gas to thus reduce the movement speed thereof, so that the period of time for observation is increased. The inert gas to be encapsulated includes He, $N_2$, Ne, Ar, Kr, and Xe, for example. Inert gas of equal to or less than about 300 Torr, for example, is preferably encapsulated in the gas cell. In addition, in order to reduce or prevent influences on the EIT signal by a temperature characteristic of the buffer gas, inert gases having different temperature characteristics are preferably simultaneously encapsulated. For example, Ar having a negative temperature characteristic and $N_2$ having a positive temperature characteristic are preferably simultaneously encapsulated in the gas cell.

Cs as the alkali metal gas and mixed gas of Ar and Ne as the buffer gas (a ratio of Ar and Ne is about 7:3 and a total pressure is about 75 Torr), for example, are preferably encapsulated in the gas cell 2. In addition, the operating temperature of the gas cell 2 is preferably about 67° C., for example, and as the container size of the gas cell 2, the length thereof in the direction of the optical axis is preferably about 2 mm, for example.

It is known that when an external magnetic field is applied to the gas cell 2, energy levels of the alkali metal atoms undergo Zeeman splitting and a plurality of EIT signals are obtained. To cope with this, in order to reduce such influences by the external magnetic field, the gas cell 2 includes a magnetic shield 2b and a bias magnetic field 2c. A magnetic material such as electromagnetic soft iron, silicon steel, permalloy, and amorphous iron, for example, is preferably used for the magnetic shield 2b. Preferably, the bias magnetic field 2c is generated using a three-axis Helmholtz coil (not illustrated) and is applied as a magnetic field of about 100 mG, for example, in the optical axis direction. Note that the configuration in which the bias magnetic field 2c is applied to the gas cell 2 is not limited to the Helmholtz coil.

A PD (photo diode), for example, is preferably used as the light detector 3. The PD is an element that converts light into a current and is, for example, a PIN photodiode of Si that has an absorption band in a near-infrared wavelength region. Although the PIN photodiode is able to respond at high speed by applying a reverse bias voltage thereto, the reverse bias voltage is not applied because high-speed response is not particularly required when the PIN photodiode is used for the atomic oscillator.

The light detector 3 detects a peak position of the EIT signal and a peak position of an absorption line from a signal obtained by the PD. In order to obtain a preferable EIT signal, CPT is generated at the peak position of the absorption line, and the peak position of the absorption line corresponds to the wavelength of the light from the light source 1.

The light source wavelength control circuit 7 controls the wavelength of the light from the light source 1. Specifically, the light source wavelength control circuit 7 corrects a current (or voltage) of a DC power source (not illustrated) according to the peak position of the absorption line obtained by the light detector 3, and controls to stabilize the wavelength of the light from the light source 1 at the peak position of the absorption line.

The frequency control circuit 8 generates an RF signal to be superimposed on the driving current of the light source 1 in response to the signal obtained from the light detector 3, and controls the frequency of the RF signal such that the inside of the gas cell 2 is in a CPT state. Specifically, the frequency control circuit 8 generates the RF signal of about 4.596315885 kHz that is input to the light source 1 using a voltage controlled oscillator (VCO) and a phase locked loop (PLL) based on a signal (about 10 MHz) of a temperature compensated crystal oscillator (TCXO). Note that the frequency control circuit 8 modulates (e.g., about 10 kHz) the frequency of the RF signal and sweeps the wavelength of the light from the light source 1 such that the peak position of the EIT signal and the peak position of the absorption line are able to be detected by the light detector 3.

In the atomic oscillator 100 according to the first preferred embodiment, as described above, the alkali metal atoms in the solid or liquid are collected and adhered to the incident window 2F of the gas cell 2 and are used as the neutral density filter (see FIG. 3). Hereinafter, the atomic oscillator 100 according to the first preferred embodiment will be described with reference to experimental results. On the incident window 2F of the gas cell 2 illustrated in FIG. 3, the alkali metal atoms 10 (for example, Cs) in the solid or liquid state are collected. Therefore, the light incident on the incident window 2F of the gas cell 2 is scattered or is absorbed by the alkali metal atoms 10, so that the transmittance of the light incident on the incident window 2F is lowered. Note that although in the following description, experimental results using Cs as the alkali metal atoms 10 are shown, the same or similar advantageous effects are able to be obtained even when alkali metal atoms of K, Na, or Rb are used.

Figure 4:
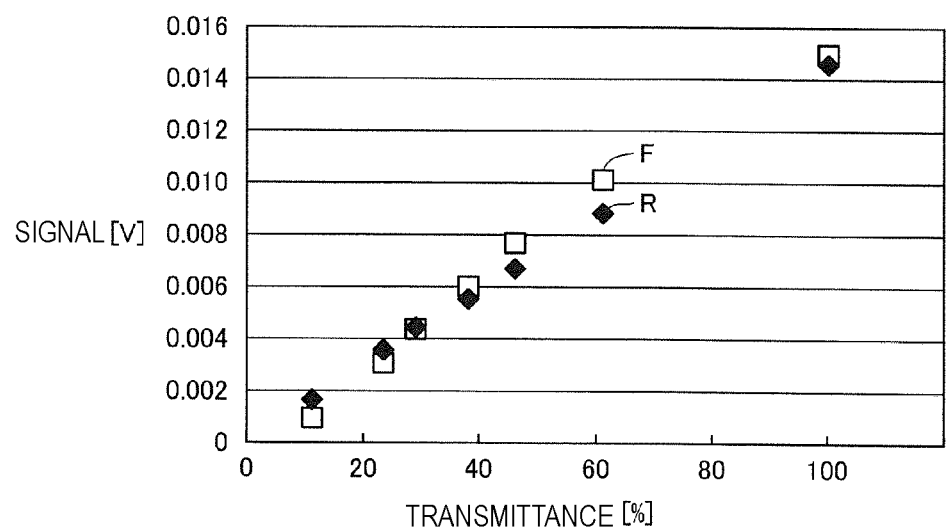
FIG. 4 is a graph for explaining a relationship between transmittance of light from a light source and signal intensity at a light detector.

FIG. 4 is a diagram for explaining a relationship between the transmittance of the light from the light source 1 and the signal intensity in the light detector 3. In FIG. 4, the horizontal axis is the transmittance (%) and the vertical axis is the signal intensity (V). As illustrated in FIG. 4, as more alkali metal atoms 10 are collected on the incident window 2F, the transmittance is lowered, and accordingly, the intensity of the light detected by the light detector 3 is lowered. In FIG. 4, measurement results obtained when the alkali metal atoms 10 are collected at the incident window 2F side are indicated by points F, and measurement results when the alkali metal atoms 10 are collected at the emission window 2R side are indicated by points R. The relationship between the transmittance of the light from the light source 1 and the signal intensity in the light detector 3 is the same or substantially the same between the case in which the alkali metal atoms 10 are collected at the incident window 2F side and the case in which they are collected at the emission window 2R side.

As the linewidth of the EIT signal is narrower, the EIT signal obtained by the atomic oscillator 100 is more preferable. However, the linewidth of the EIT signal is increased because of power broadening and light shift. The power broadening is a phenomenon that the linewidth of the EIT signal is increased as the intensity density of the light incident on the alkali metal gas, such as Cs is higher. Therefore, by disposing the neutral density filter between the light source and the gas cell, it is possible to attenuate the intensity of the light incident on the gas cell, thus reducing or preventing the power broadening.

The light shift is a phenomenon that when the light is incident on the alkali metal gas, the intrinsic energy levels of the alkali metal gas change with influences by the light. In other words, the light shift causes the frequency at which the EIT signal is generated to vary slightly with the influences by the light. Further, since the light shift is influenced also by changes in the intensity of the incident light, it is possible to reduce or prevent the light shift by attenuating the intensity of the incident light by the neutral density filter, thus reducing the change in the intensity of the light incident on the gas cell 2 relative to the change in the light source 1.

In order to obtain the preferable EIT signal with the narrow linewidth of the EIT signal, the atomic oscillator 100 needs to reduce or prevent the power broadening and the light shift. The conventional atomic oscillator attenuates the intensity of light incident on the gas cell with the neutral density filter. On the other hand, the atomic oscillator 100 attenuates the intensity of the light incident on the gas cell 2 (see FIG. 4) by adhering the alkali metal atoms 10 to the incident window 2F side and using them as the neutral density filter as illustrated in FIG. 3.

Figure 5:
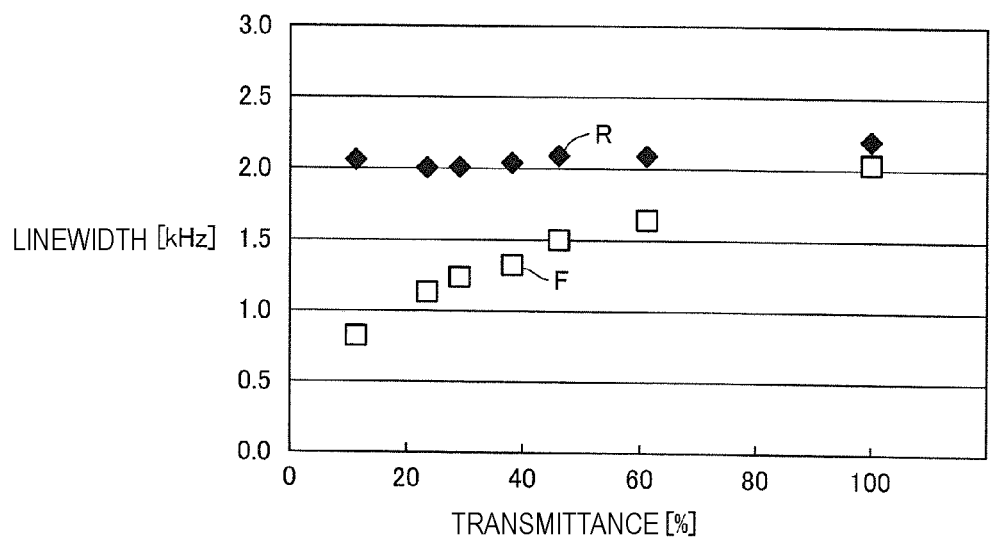
FIG. 5 is a graph for explaining a relationship between the transmittance of the light from the light source and a linewidth of an EIT signal.

Specifically, the preferable EIT signal with the narrow linewidth of the EIT signal that is obtained by collecting the alkali metal atoms 10 at the incident window 2F side will be described. FIG. 5 is a diagram for explaining the relationship between the transmittance of the light from the light source and the linewidth of the EIT signal. In FIG. 5, the horizontal axis is the transmittance (%) and the vertical axis is the linewidth (Hz). As illustrated in FIG. 5, when the alkali metal atoms 10 are collected at the incident window 2F side to lower the transmittance, the linewidth of the EIT signal becomes narrow (points F). For example, regarding the points F, when the transmittance is 100% (dimming ratio of 0%), the linewidth of the EIT signal is about 2.0 kHz whereas when the transmittance is about 60% (dimming ratio of about 40%), the linewidth of the EIT signal is about 1.6 kHz and is improved by about 20%. Further, when the transmittance is about 10% (the dimming ratio of about 90%), the linewidth of the EIT signal is about 0.8 kHz and is improved by about 60%. Note that as a comparative example, when the alkali metal atoms 10 are collected at the emission window 2R side, the linewidth of the EIT signal does not change even if the transmittance is lowered (points R). For example, regarding the points R, when the transmittance is about 60% (dimming ratio of about 40%), the linewidth of the EIT signal is about 2.1 kHz whereas when the transmittance is about 10% (dimming ratio of about 90%), the linewidth of the EIT signal is about 2.1 kHz and does not change. These results are obtained because even when the alkali metal atoms 10 are collected at the emission window 2R side, the intensity of the light incident on the gas cell 2 cannot be attenuated and the power broadening and the light shift cannot be reduced or prevented.

As indicated by the points R in FIG. 5, even when the alkali metal atoms 10 are collected and adhered to the emission window 2R side to change the transmittance at the emission window 2R side, the linewidth of the EIT signal is not influenced. However, as illustrated in FIG. 4, since the intensity of the light passing through the emission window 2R is attenuated by the alkali metal atoms 10 that have adhered to the emission window 2R side, the signal intensity of the light that is able to be detected by the light detector 3 is lowered. Therefore, the alkali metal atoms 10 that have adhered to the emission window 2R side may deteriorate the characteristic of the EIT signal.

When the alkali metal atoms 10 are collected at the incident window 2F side, the alkali metal atoms 10 in a state of being distributed in a granular structure adhere to the incident window 2F at the internal space 2a side. Although the alkali metal atoms 10 are considered to adhere in this manner with the relationship with the member of the incident window 2F, the state of the alkali metal atoms 10 adhering to the incident window 2F at the internal space 2a side is not limited to the granular structure and may be a uniform film structure as long as the transmittance of the light is the same.

Here, the transmittance is defined as a ratio of the intensity of the light output from the emission window 2R after passing through the inside of the gas cell 2 relative to the intensity of the light entering from the incident window 2F of the gas cell 2. However, when the alkali metal atoms 10 are actually adhered to the incident window 2F of the actual gas cell 2, reflection and absorption by the member (e.g., glass) of the incident window 2F influences the measurement of the transmittance. Therefore, it is necessary to separately measure the reflection and absorption by the member of the incident window 2F and eliminate the influences. Note that since the absorption amount of the absorption line itself is influenced by the intensity of light, the transmittance is measured at a wavelength shifted from an absorption wavelength of the alkali metal atoms 10. Note that the dimming ratio is obtained by 100%-transmittance.

Figure 6:
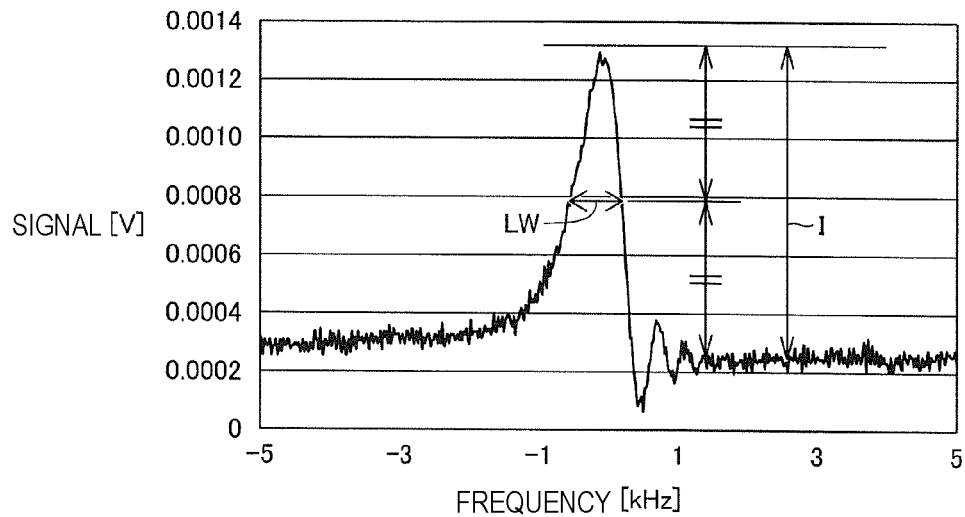
FIG. 6 is a graph for explaining a relationship between a frequency of the light from the light source and the EIT signal.

Further, the signal intensity of the EIT signal and the linewidth of the EIT signal will be described. FIG. 6 is a diagram for explaining the relationship between the frequency of the light from the light source 1 and the EIT signal. In FIG. 6, the horizontal axis is the frequency (kHz) and the vertical axis is the signal intensity (V) of the EIT signal, respectively. In FIG. 6, the frequency is converted for illustration such that the frequency at which the signal intensity of the EIT signal becomes maximum is 0 kHz. A signal intensity I of the EIT signal is a difference between the signal intensity at the peak of the EIT signal and the signal intensity at the bottom of the EIT signal. A linewidth LW of the EIT signal is a frequency width at which the signal intensity I of the EIT signal is about 50%.

As described above, the atomic oscillator 100 according to the first preferred embodiment includes the light source 1, the gas cell 2 including the internal space 2a in which the alkali metal atoms 10 are encapsulated, and the light detector 3 that detects the light which has been emitted from the light source 1 and has passed through the gas cell 2. The gas cell 2 includes the incident window 2F through which the light from the light source 1 is incident, the emission window 2R through which the light is emitted to the light detector 3, and the side wall supporting the incident window 2F and the emission window 2R. By adhering the alkali metal atoms 10 encapsulated in the internal space 2a to at least the incident window 2F in the liquid state or the solid state, the light incident on the incident window 2F is reduced. Therefore, the atomic oscillator 100 is able to provide the preferable EIT signal without providing the neutral density filter itself. Even when the atomic oscillator 100 cannot eliminate the need for the neutral density filter itself, a neutral density filter having a high dimming characteristic is not required to be used because the atomic oscillator 100 is able to reduce the light incident on the incident window 2F to some extent by the alkali metal atoms 10 that are adhered to the incident window 2F.

The atomic oscillator 100 is not required to include the neutral density filter having the high dimming characteristic to obtain the preferable EIT signal, thus the thickness is able to be reduced when an absorption type neutral density filter is used. In the atomic oscillator 100, the amount of the alkali metal atoms 10 that are adhered to the incident window 2F in the liquid state or the solid state is larger than the amount of the alkali metal atoms 10 that are adhered to the other surfaces. Therefore, adhesion of the alkali metal atoms 10 to the emission window 2R side, which does not contribute to the improvement in the linewidth of the EIT signal, is able to be reduced or prevented. The atomic oscillator 100 is able to reduce or prevent deterioration in the characteristic of the EIT signal by reducing or preventing the adhesion of the alkali metal atoms 10 to the emission window 2R side.

In the atomic oscillator 100, at least the temperature of the incident window 2F is lower than the temperature of the emission window 2R. Therefore, the alkali metal atoms 10 (e.g., Cs) that are encapsulated in the gas cell 2 so as to have the gas pressure of the alkali metal atoms 10, which is higher than the saturation vapor pressure, adhere to the incident window 2F side in the solid or liquid state. The alkali metal atoms 10 which have adhered to the incident window 2F side and are in the solid or liquid state have the same or substantially the same function as the neutral density filter. Therefore, the atomic oscillator 100 is able to eliminate the need for the neutral density filter and simplify the optical system by setting the transmittance of the alkali metal atoms 10 adhering to the incident window 2F side to be the same or substantially the same as that of the neutral density filter. The atomic oscillator 100 is able to improve the linewidth of the EIT signal (see FIG. 5) when the alkali metal atoms 10 adhering to the incident window 2F side is able to be set so as to reduce the light from the light source 1 by equal to or more than about 40% (transmittance: equal to or lower than about 60%) on the incident window 2F of the gas cell 2.

Figure 7A:
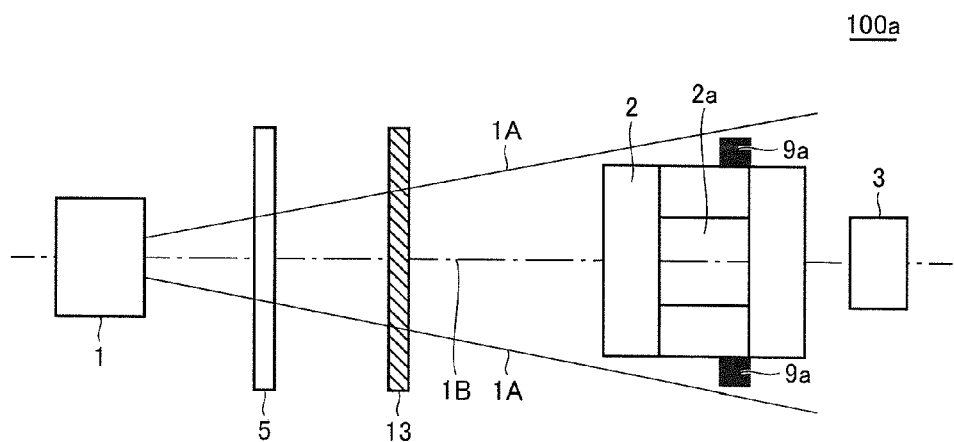
FIGS. 7A and 7B are schematic diagrams for explaining the configuration of an atomic oscillator and a gas cell according to a modification of the first preferred embodiment of the present invention.
Figure 7B:
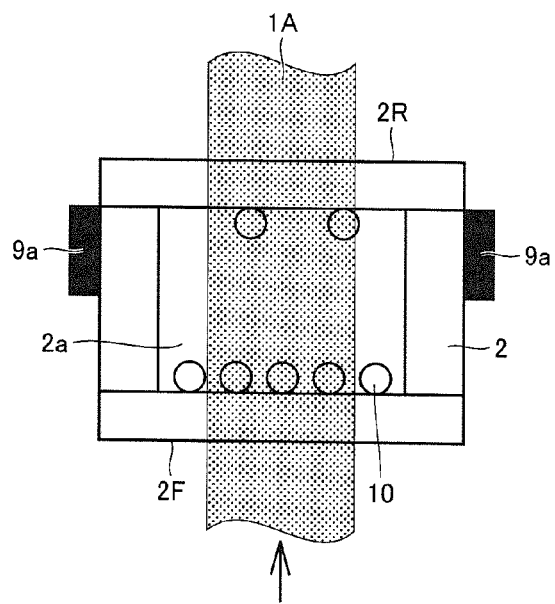

In the atomic oscillator 100, the heater 9a (first heating portion) is provided on the emission window 2R of the gas cell 2 to heat the emission window 2R, so that a large amount of the alkali metal atoms 10 in the solid or liquid state are collected and adhered to the incident window 2F by heating the emission window 2R by the heater 9a. However, the heater 9a is not limited to be provided on the emission window 2R as long as a large amount of the alkali metal atoms 10 in the solid or liquid state are able to be collected on the incident window 2F. FIGS. 7A and 7B are schematic diagrams for explaining the configuration of an atomic oscillator 100a and the gas cell 2 according to a modification of the first preferred embodiment of the present invention. Note that FIG. 7A illustrates the configuration of the atomic oscillator 100a, and FIG. 7B illustrates the gas cell 2.

The atomic oscillator 100a illustrated in FIG. 7A includes a heater 9a that is provided on the side wall (side surface) of the gas cell 2 at the emission window 2R side to heat the side wall at the emission window 2R side, so that a large amount of the alkali metal atoms 10 in the solid or liquid state are collected and adhered to the incident window 2F. In the gas cell 2 illustrated in FIG. 7B, a large amount of the alkali metal atoms 10 in the solid or liquid state adhere to the incident window 2F by heating the side wall at the emission window 2R side with the heater 9a. Therefore, also in the gas cell 2 illustrated in FIG. 7B, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 7B, the same reference numerals denote the same or similar components as those of the gas cell 2 illustrated in FIG. 3, and detailed description thereof will be omitted.

In the atomic oscillator 100 illustrated in FIG. 1, the light emitted from the light source 1 is converted into the parallel light by the optical member 4 which is the collimator lens, and the parallel light after the conversion is incident on the gas cell 2 and is detected by the light detector 3. However, the light passing through the gas cell 2 is not limited to the parallel light. In the atomic oscillator 100a illustrated in FIG. 7A, the light emitted from the light source 1 spreads until it reaches the light detector 3. In the atomic oscillator 100a, no optical member 4 is provided because it is not necessary to convert the light emitted from the light source 1 into parallel light. Further, in the atomic oscillator 100a, a neutral density filter 13 is provided because the intensity of the light from the light source 1 cannot be sufficiently attenuated only by the alkali metal atoms 10 in the solid or liquid state, which have adhered to the incident window 2F of the gas cell 2. In the atomic oscillator 100a, the same reference numerals denote the same or similar components as those of the atomic oscillator 100 illustrated in FIG. 1, and detailed description thereof will be omitted.

The neutral density filter 13 is preferably, for example, an ND (Neutral Density) filter to attenuate the intensity of the light from the light source 1. When the intensity of the light incident on the gas cell 2 is excessively attenuated by the neutral density filter 13, the EIT signal itself cannot be observed. Therefore, it is necessary to set an optimum ND value in consideration of the limit of detection of the EIT signal. The neutral density filter 13 may preferably be a reflection filter in which a metal film is provided on a glass substrate and reflects light or an absorption filter in which a material itself absorbs light.

The neutral density filter 13 that is used for the atomic oscillator 100a attenuates the intensity of the light from the light source 1, which is incident on the gas cell 2, in combination with the alkali metal atoms 10 in the solid or liquid state, which have adhered to the incident window 2F of the gas cell 2. Therefore, when the absorption neutral density filter 13 is provided, the thickness thereof is able to be reduced because the neutral density filter 13 is not required to have a high dimming characteristic.

Figure 8:
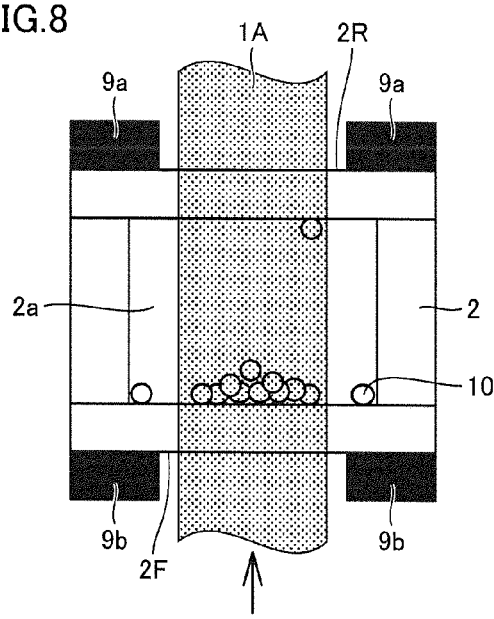
FIG. 8 is a diagram for explaining a gas cell according to another modification of the first preferred embodiment of the present invention.

Further, another modification will be described. In the gas cell 2 illustrated in FIG. 3, the heater 9a is provided only on the emission window 2R. However, as long as a large amount of the alkali metal atoms 10 in the solid or liquid state are able to be collected on the incident window 2F, the configuration of the gas cell is not limited to the configuration in which the heater 9a is provided only on the emission window 2R. FIG. 8 is a diagram for explaining the gas cell 2 according to another modification of the first preferred embodiment of the present invention. In the gas cell 2 illustrated in FIG. 8, the same reference numerals denote the same or similar components as those of the gas cell 2 illustrated in FIG. 3, and detailed description thereof will be omitted.

In the gas cell 2 illustrated in FIG. 8, a heater 9a is provided on the emission window 2R, and a heater 9b (second heating portion) is provided on the incident window 2F at the side wall side. With this configuration, the gas cell 2 illustrated in FIG. 8 enables the emission window 2R to be heated by the heater 9a and the outer side (side wall side) of the incident window 2F to be heated by the heater 9b, such that the alkali metal atoms 10 in the solid or liquid state are able to be collected and adhered to a central portion of the incident window 2F. The light from the light source 1 passes through the internal space 2a of the gas cell 2 and reaches the light detector 3. Therefore, it is possible to further attenuate the intensity of the light having an optical axis 1B passing through the central axis of the gas cell 2 because the amount of the alkali metal atoms 10 that are adhered in the liquid state or the solid state is larger in the central portion than in a peripheral portion of the incident window 2F.

In addition, in the case of the laser light, such as the VCSEL that is used for the light source 1, for example, the intensity of the light is increased toward the central portion, and the intensity of the light has Gaussian distribution in a direction perpendicular or substantially perpendicular to the optical axis. Therefore, it is possible to make the intensity of the light uniform by adhering a large amount of the alkali metal atoms 10 in the solid or liquid state to the central portion of the incident window 2F.

In order to make a large amount of the alkali metal atoms 10 in the solid or liquid state adhere to the central portion of the incident window 2F, the temperature control circuit 9 (temperature adjusting portion) adjusts the temperature of the heater 9b (second heating portion) to be lower than the temperature of the heater 9a (first heating portion). Further, the heater 9b is not limited to being provided on the incident window 2F at the side wall side and may be provided on the side wall at the incident window 2F side.

Second Preferred Embodiment

Figure 9:
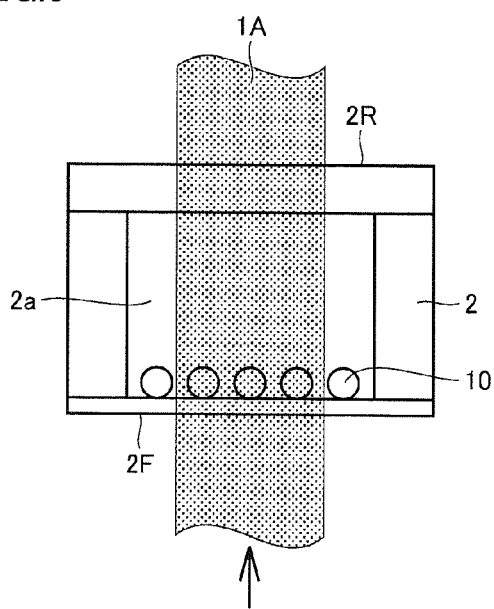
FIG. 9 is a diagram for explaining a gas cell according to a second preferred embodiment of the present invention.

In the atomic oscillator 100 according to the first preferred embodiment, the heater 9a is provided on the emission window 2R of the gas cell 2 to heat the emission window 2R, so that a large amount of the alkali metal atoms 10 in the solid or liquid state are collected and adhered to the incident window 2F. However, the configuration of the gas cell is not limited to the configuration in which the heater 9a is provided as long as a large amount of the alkali metal atoms 10 in the solid or liquid state are collected and adhered to the incident window 2F. FIG. 9 is a diagram for explaining a gas cell according to a second preferred embodiment of the present invention.

In the gas cell 2 illustrated in FIG. 9, the thickness of the incident window 2F is smaller than that of the emission window 2R, so that a heat dissipation property at the incident window 2F side is improved. The gas cell 2 having the high heat dissipation property at the incident window 2F side causes a temperature gradient such that the temperature of the incident window 2F is lower than that of the emission window 2R to be generated in the internal space 2a. Therefore, the saturated vapor pressure at the incident window 2F side is lower than that at the emission window 2R side, and a large amount of the alkali metal atoms 10 in the solid or liquid state are collected on the incident window 2F. In the gas cell 2 illustrated in FIG. 9, a large amount of the alkali metal atoms 10 in the solid or liquid state adhere to the incident window 2F having the small thickness. Therefore, in the gas cell 2 illustrated in FIG. 9, similarly to the gas cell 2 illustrated in FIG. 3, the alkali metal atoms 10 in the solid or liquid state, which have adhered to the incident window 2F, are able to define and function as a neutral density filter. In the gas cell 2 illustrated in FIG. 9, the same reference numerals denote the same or similar components as those of the gas cell 2 illustrated in FIG. 3, and detailed description thereof will be omitted.

As described above, in the gas cell 2, since the thickness of the incident window 2F is smaller than the thickness of the emission window 2R, the heat dissipation property is high at the incident window 2F side and a large amount of the alkali metal atoms 10 in the solid or liquid state are able to be collected and adhered to the incident window 2F.

Figure 10:
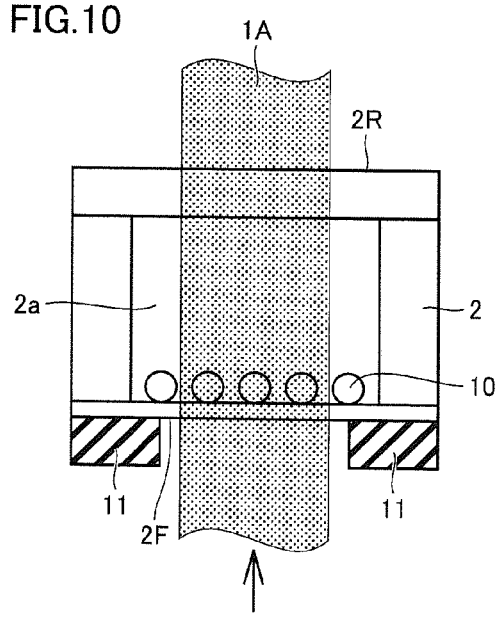
FIG. 10 is a diagram for explaining a gas cell according to a modification of the second preferred embodiment of the present invention.

In order to improve the heat dissipation property at the incident window 2F side, a heat dissipating member may be provided at the incident window 2F side. FIG. 10 is a diagram for explaining the gas cell 2 according to a modification of the second preferred embodiment of the present invention. In the gas cell 2 illustrated in FIG. 10, a heat dissipating member 11 is provided on the incident window 2F having the smaller thickness than that of the emission window 2R to further enhance the heat dissipation property at the incident window 2F side. The heat dissipating member 11 has a high heat dissipation property, for example, a material having high heat conductivity (e.g., carbon, glass, silicon, or a metal material such as aluminum), a member having an increased heat dissipation property by processing a metal material into a fin shape, a member that electrically drives a cooling fan, or a combination of these members. It is preferable that the heat dissipating member 11 is made of a non-magnetic material that does not influence the bias magnetic field 2c. Further, the position at which the heat dissipating member 11 is provided is not limited to the position on the incident window 2F at the side wall side, and the heat dissipating member 11 may be provided on the side wall at the incident window 2F side. In the gas cell 2 illustrated in FIG. 10, a large amount of the alkali metal atoms 10 in the solid or liquid state adhere to the incident window 2F provided with the heat dissipating member 11. Therefore, in the gas cell 2 illustrated in FIG. 10, similarly to the gas cell 2 illustrated in FIG. 3, the alkali metal atoms 10 in the solid or liquid state, which have adhered to the incident window 2F, are able to define and function as a neutral density filter. In the gas cell 2 illustrated in FIG. 10, the same reference numerals denote the same or similar components as those of the gas cell 2 illustrated in FIG. 3, and detailed description thereof will be omitted.

As described above, in the gas cell 2, by providing the heat dissipating member 11 at the incident window 2F side, the heat dissipation property at the incident window 2F side is improved and a large amount of the alkali metal atoms 10 in the solid or liquid state are able to be collected and adhered to the incident window 2F. Note that in the gas cell 2 illustrated in FIG. 10, the heat dissipating member 11 is provided on the incident window 2F having the smaller thickness than that of the emission window 2R. However, as long as the heat dissipation property at the incident window 2F side is able to be improved, the dissipating member 11 may be provided on the incident window 2F having the same thickness as that of the emission window 2R.

Third Preferred Embodiment

Figure 11:
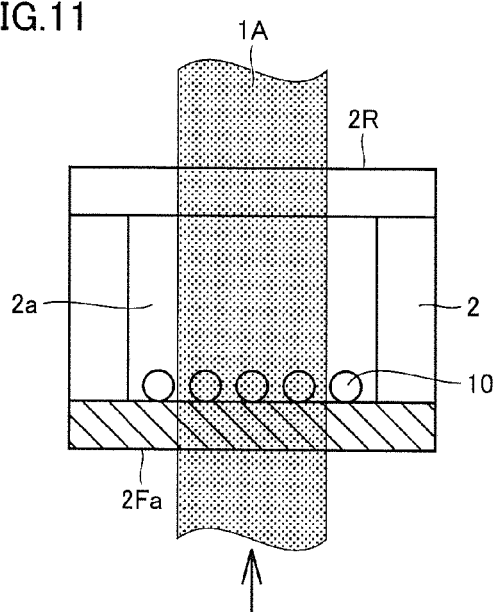
FIG. 11 is a diagram for explaining a gas cell according to a third preferred embodiment of the present invention.

In the gas cell 2 according to the second preferred embodiment, the thickness of the incident window 2F is smaller than that of the emission window 2R to improve the heat dissipation property at the incident window 2F side, so that a large amount of the alkali metal atoms 10 in the solid or liquid state are collected and adhered to the incident window 2F. However, as long as the heat dissipation property at the incident window 2F side is improved and a large amount of the alkali metal atoms 10 in the solid or liquid state are collected and adhered to the incident window 2F, the configuration of the gas cell is not limited to the configuration using the incident window 2F having the smaller thickness than that of the emission window 2R. FIG. 11 is a diagram for explaining a gas cell according to a third preferred embodiment of the present invention.

In the gas cell 2 illustrated in FIG. 11, a member having higher heat conductivity than that of the emission window 2R is used for an incident window 2Fa, so that a heat dissipation property at the incident window 2Fa side is improved. The gas cell 2 having the high heat dissipation property at the incident window 2Fa side causes a temperature gradient such that the temperature of the incident window 2Fa is lower than that of the emission window 2R to be generated in the internal space 2a. Therefore, the saturated vapor pressure at the incident window 2Fa side becomes lower than that at the emission window 2R side, and a large amount of the alkali metal atoms 10 in the solid or liquid state are collected on the incident window 2Fa. In the gas cell 2 illustrated in FIG. 11, a large amount of the alkali metal atoms 10 in the solid or liquid state adhere to the incident window 2Fa having high heat conductivity. Therefore, also in the gas cell 2 illustrated in FIG. 11, similarly to the gas cell 2 illustrated in FIG. 3, the alkali metal atoms 10 in the solid or liquid state, which have adhered to the incident window 2Fa, define and function as a neutral density filter. In the gas cell 2 illustrated in FIG. 11, the same reference numerals denote the same or similar components as those of the gas cell 2 illustrated in FIG. 3, and detailed description thereof will be omitted.

The incident window 2Fa having the high heat conductivity may be made of a single material or a composite material. For example, the incident window 2Fa may preferably be made of the composite material such that a portion transmitting the light from the light source 1 is made of glass and a portion other than the portion is made of a metal material.

As described above, in the gas cell 2, since the heat conductivity of the incident window 2Fa is higher than that of the emission window 2R, a large amount of the alkali metal atoms 10 in the solid or liquid state is able to be collected and adhered to the incident window 2Fa.

Figure 12:
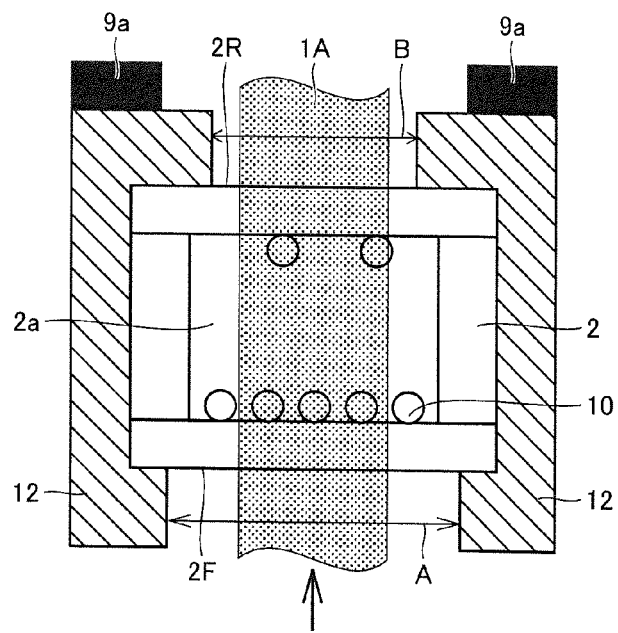
FIG. 12 is a diagram for explaining a gas cell according to a modification of the third preferred embodiment of the present invention.

Instead of using the member having the high heat conductivity for the incident window, it may be provided outside of the gas cell 2. FIG. 12 is a diagram for explaining the gas cell 2 according to a modification of the third preferred embodiment of the present invention. In the gas cell 2 illustrated in FIG. 12, the overall gas cell 2 is covered with a member 12 having high heat conductivity (e.g., a non-magnetic metal material such as aluminum, brass, or other suitable material), and the gas cell 2 is heated by the heater 9a with the member 12 having high heat conductivity interposed therebetween. In other words, in the gas cell 2 illustrated in FIG. 12, instead of directly heating the gas cell 2 by the heater 9a, the gas cell 2 is indirectly heated by the member 12 having the high heat conductivity. In the gas cell 2 illustrated in FIG. 12, since the gas cell 2 is indirectly heated with the member 12 having the high heat conductivity interposed therebetween, the position of the heater 9a may be any position on the member 12 having the high heat conductivity, and the position is not particularly limited.

Further, the member 12 having the high heat conductivity includes an opening A at the incident window 2F side, which is larger than an opening B at the emission window 2R side. Therefore, a contact area between the gas cell 2 and the member 12 having the high heat conductivity at the incident window 2F side is smaller than that at the emission window 2R side, so that a heating capacity at the incident window 2F side is reduced. The gas cell 2 having the small heating capacity at the incident window 2F side causes a temperature gradient such that the temperature of the incident window 2F is lower than that of the emission window 2R to be generated in the internal space 2a. Therefore, the saturated vapor pressure at the incident window 2F side is lower than that at the emission window 2R side, and a large amount of the alkali metal atoms 10 in the solid or liquid state are collected on the incident window 2F. In the gas cell 2 illustrated in FIG. 12, a large amount of the alkali metal atoms 10 in the solid or liquid state adhere to the incident window 2F with the large opening A. Therefore, in the gas cell 2 illustrated in FIG. 12, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 12, the same reference numerals denote the same or similar components as those of the gas cell 2 illustrated in FIG. 3, and detailed description thereof will be omitted.

As described above, by covering the gas cell 2 with the member 12 having the high heat conductivity and making the opening A at the incident window 2F side larger than the opening B at the emission window 2R side, the gas cell 2 is able to decrease the heating capacity at the incident window 2F side and collect and adhere a large amount of the alkali metal atoms 10 in the solid or liquid state to the incident window 2F.

Fourth Preferred Embodiment

Figure 13A:
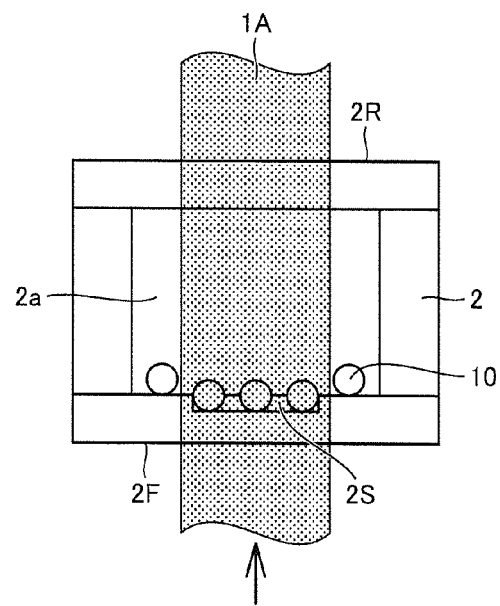
FIGS. 13A and 13B are diagrams for explaining a gas cell according to a fourth preferred embodiment of the present invention.
Figure 13B:
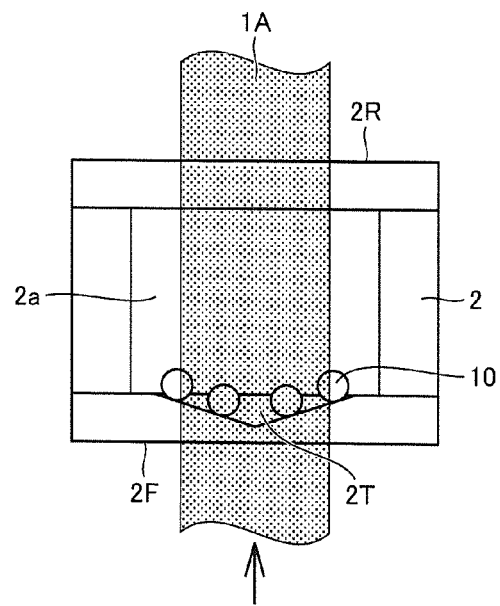

In the gas cell 2 according to the second preferred embodiment, the thickness of the incident window 2F is smaller than that of the emission window 2R to improve the heat dissipation property at the incident window 2F side, so that a large amount of the alkali metal atoms 10 in the solid or liquid state are collected and adhered to the incident window 2F. However, there is no particular limitation on the configuration of the gas cell as long as a large amount of the alkali metal atoms 10 in the solid or liquid state are collected and adhered to the incident window 2F. FIGS. 13A and 13B are diagrams for explaining a gas cell according to a fourth preferred embodiment of the present invention.

In the gas cell 2 illustrated in FIGS. 13A and 13B, a large amount of the alkali metal atoms 10 in the solid or liquid state are collected on the incident window 2F by providing a groove on the surface of the incident window 2F at the internal space 2a side. In the gas cell 2 illustrated in FIG. 13A, a groove 2S is provided in a portion (central portion) of the incident window 2F transmitting the light 1A emitted from the light source 1. The groove 2S is lower than the other portion of the surface of the incident window 2F, and a large amount of the alkali metal atoms 10 in the solid or liquid state are collected therein. In the gas cell 2 illustrated in FIG. 13A, a large amount of the alkali metal atoms 10 in the solid or liquid state adhere to the incident window 2F provided with the groove 2S. Therefore, in the gas cell 2 illustrated in FIG. 13A, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 13A, the same reference numerals denote the same or similar components as those in the gas cell 2 illustrated in FIG. 3, and detailed description thereof will be omitted.

The shape of the groove is not limited to that of the groove 2S illustrated in FIG. 13A and may be a shape that the groove becomes deeper toward the central portion of the incident window 2F such as a groove 2T illustrated in FIG. 13B. In the gas cell 2 illustrated in FIG. 13B, by making the groove 2T deeper toward the central portion of the incident window 2F, a large amount of the alkali metal atoms 10 in the solid or liquid state are collected and adhered to the central portion of the incident window 2F. Therefore, in the gas cell 2 illustrated in FIG. 13B, the intensity of the light from the light source 1 incident on the gas cell 2 is able to be further attenuated, so that it is possible to make the intensity of the light uniform for the laser light having the Gaussian distribution.

In the gas cell 2 illustrated in FIG. 13B, a large amount of the alkali metal atoms 10 in the solid or liquid state adhere to the incident window 2F provided with the groove 2T. Therefore, in the gas cell 2 illustrated in FIG. 13B, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 13B, the same reference numerals denote the same or similar components as those of the gas cell 2 illustrated in FIG. 3, and detailed description thereof will be omitted. Note that the number of grooves is not limited to one provided in the central portion of the incident window 2F as illustrated in FIGS. 13A and 13B. For example, although not illustrated in the drawing, a plurality of small grooves may be provided in the central portion of the incident window 2F.

As described above, since at least one groove 2S or 2T (recess) is provided in the central portion of the surface of the incident window 2F at the internal space 2a side, a large amount of the alkali metal atoms 10 in the solid or liquid state are able to be collected and adhered to the incident window 2F. Further, by making the central portion of the groove 2T (recess) deeper than the peripheral portion thereof, it is possible to collect a large amount of the alkali metal atoms 10 in the solid or liquid state in the central portion of the incident window 2F. As for the groove formation position, although the groove 2S or 2T is provided in the central portion of the incident window 2F as illustrated in FIGS. 13A and 13B because the light is incident on the gas cell 2 at the central portion of the incident window 2F, when the light is incident on a position deviating from the central portion of the incident window 2F, the groove 2S or 2T is preferably provided at a position shifted in accordance with the incident position of the light.

Fifth Preferred Embodiment

Figure 14A:
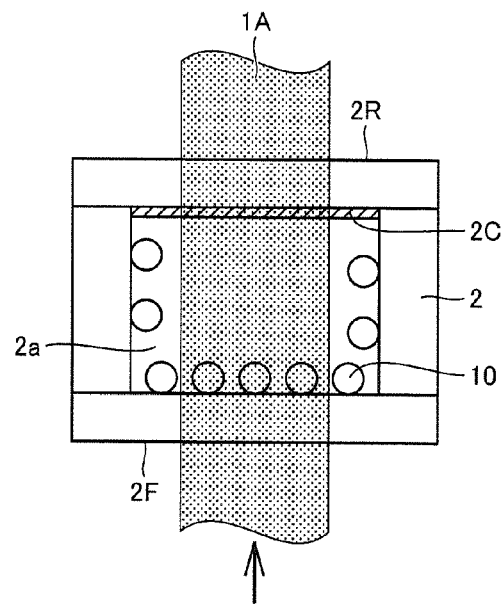
FIGS. 14A and 14B are diagrams for explaining a gas cell according to a fifth preferred embodiment of the present invention.
Figure 14B:
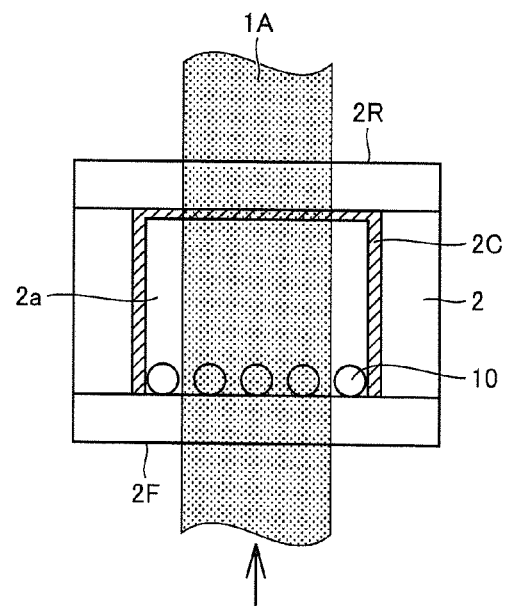

In the gas cell 2 according to the second preferred embodiment, the thickness of the incident window 2F is smaller than that of the emission window 2R to improve the heat dissipation property at the incident window 2F side, so that a large amount of the alkali metal atoms 10 in the solid or liquid state are collected and adhered to the incident window 2F. However, there is no particular limitation on the configuration of the gas cell as long as a large amount of the alkali metal atoms 10 in the solid or liquid state are collected and adhered to the incident window 2F. FIGS. 14A and 14B are diagrams for explaining a gas cell according to a fifth preferred embodiment of the present invention.

In the gas cell 2 illustrated in FIGS. 14A and 14B, by providing a coating film which reduces or prevents adhesion of the alkali metal atoms 10 to at least the surface of the emission window 2R at the internal space 2a side, a large amount of the alkali metal atoms 10 in the solid or liquid state are collected on the incident window 2F. In the gas cell 2 illustrated in FIG. 14A, a coating film 2C preferably made of a paraffin-based material, for example, is provided on the surface of the emission window 2R at the internal space 2a side. Since adhesion of the alkali metal atoms 10 to the surface of the emission window 2R on which the coating film 2C made of the paraffin-based material is provided is reduced or prevented, a large amount of the alkali metal atoms 10 in the solid or liquid state are collected on the surface of the incident window 2F. In the gas cell 2 illustrated in FIG. 14A, since the coating film 2C is provided on the surface of the emission window 2R, a large amount of the alkali metal atoms 10 in the solid or liquid state adhere to the incident window 2F on which the coating film 2C is not provided. Therefore, in the gas cell 2 illustrated in FIG. 14A, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 14A, the same reference numerals denote the same or similar components as those of the gas cell 2 illustrated in FIG. 3, and detailed description thereof will be omitted.

The surface on which the coating film 2C is provided is not limited to the surface of the emission window 2R as illustrated in FIG. 14A and may be provided on a surface in addition to the surface of the incident window 2F as illustrated in FIG. 14B. Specifically, in the gas cell 2 illustrated in FIG. 14B, the coating film 2C preferably made of the paraffin-based material, for example, is provided on the surface of the emission window 2R and the surface of the side wall. Therefore, in the gas cell 2 illustrated in FIG. 14B, since adhesion of the alkali metal atoms 10 to the surfaces other than the surface of the incident window 2F is reduced or prevented, a larger amount of the alkali metal atoms 10 in the solid or solid state are collected on the surface of the incident window 2F. In the gas cell 2 illustrated in FIG. 14B, a large amount of the alkali metal atoms 10 in the solid or liquid state adhere to the incident window 2F on which the coating film 2C is not provided. Therefore, in the gas cell 2 illustrated in FIG. 14B, similarly to the gas cell 2 illustrated in FIG. 3, the alkali metal atoms 10 in the solid or liquid state, which have adhered to the incident window 2F, define and function as a neutral density filter. In the gas cell 2 illustrated in FIG. 14B, the same reference numerals denote the same or similar components as those of the gas cell 2 illustrated in FIG. 3, and detailed description thereof will be omitted.

As described above, since the gas cell 2 further includes the coating film 2C that reduces or prevents the adhesion of the alkali metal atoms 10 in the liquid state or the solid state to the surface of the emission window 2R at the internal space 2a side, a large amount of the alkali metal atoms 10 in the solid or liquid state is able to be collected on the incident window 2F on which the coating film 2C is not provided. Note that the coating film 2C may be further provided on the surface of the side wall at the internal space 2a side. Although the above explanation is that the coating film 2C is made of the paraffin-based material, it is sufficient that it is a material that reduces or prevents the adhesion of the alkali metal atoms 10 in the liquid state or the solid state and the coating film 2C may be made of, for example, organic silicon-based compound, such as octadecyltrichlorosilane.

In the atomic oscillator according to each of the above-described preferred embodiments, the configuration in which the resonance frequency is obtained using the CPT (Coherent Population Trapping) has been described. However, the present invention is not limited thereto. Operating principles of the atomic oscillator include a double resonance method utilizing light and microwaves, and the atomic oscillator according to each of the above-described preferred embodiments is able to be applied to the double resonance method as well.

The atomic oscillator according to each of the above-described preferred embodiments may be used, for example, as a reference oscillator of an atomic clock and may be used in electronic apparatuses of cellular phone base stations requiring the reference oscillators, and electronic apparatuses, such as cellular phones (smart phones) and receivers requiring location information using a GPS system, such as a car navigation system.

Unless otherwise specifically limited, the respective structures in the atomic oscillators according to the above-described preferred embodiments may be freely combined with each other. For example, the configuration of the heater 9a provided on the gas cell 2 according to the first preferred embodiment may be combined with the configuration in which the thickness of the incident window 2F is smaller than that of the emission window 2R in the gas cell 2 according to the second preferred embodiment. Further, the configuration in which the member having the higher heat conductivity than that of the emission window 2R is used for the incident window 2Fa in the gas cell 2 according to the third preferred embodiment and the configuration in which the coating film 2C is provided on the surface of the emission window 2R at the internal space 2a side in the gas cell 2 according to the fifth preferred embodiment may be combined with each other.

Figure 15:
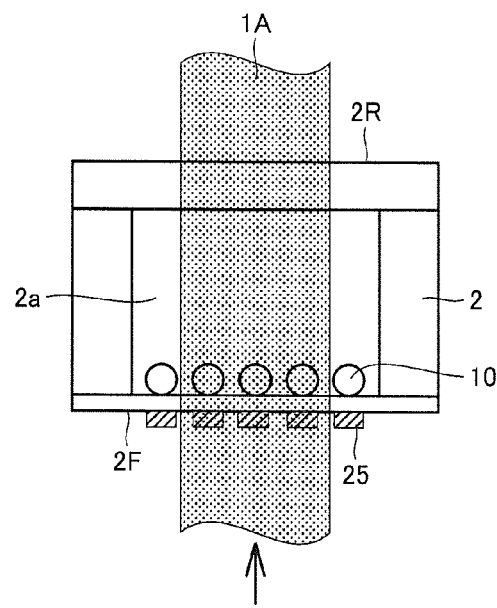
FIG. 15 is a schematic diagram for explaining the configuration of an incident window on which a pattern of a material having high heat conductivity is provided.

As a modification of the incident window 2Fa using the member having the high heat conductivity, which has been described in FIG. 11, it is conceivable to provide a pattern of a material having high heat conductivity on the surface of the incident window, for example. It is preferable to use a material having high transmittance for the wavelength of the light source as the material having the high heat conductivity. FIG. 15 is a schematic diagram for explaining the configuration of an incident window on which the pattern of the material having the high heat conductivity is provided. On the incident window 2F illustrated in FIG. 15, a net-shaped electrode pattern 25 is defined by a transparent electrode, such as ITO, on an outer surface thereof. Since a portion at which the electrode pattern 25 is provided has higher heat conductivity than other portions, it is possible to cool the vaporized alkali metal atoms in the vicinity of the portion and aggregate them into the alkali metal atoms 10 in the solid or liquid state. In other words, by providing the electrode pattern 25, the alkali metal atoms 10 in the solid or liquid state are able to be aggregated on the incident window 2F at a position at which they are desired to be aggregated. Changes in a line width of the electrode pattern 25, a formation interval, or other changes enable the desired amount of the alkali metal atoms 10 in the solid or liquid state to be aggregated at a desired position on the incident window 2F. Further, in the gas cell 2 illustrated in FIG. 15, the thickness of the incident window 2F is smaller than that of the emission window 2R. However, the thickness of the incident window 2F may be the same as or larger than that of the emission window 2R as long as a heat dissipation effect provided by the electrode pattern 25 is obtained.

It should be understood that the preferred embodiments disclosed herein are illustrative and non-limiting in all aspects. It is intended that the scope of the present invention is defined not by the above description but by the claims, and that all changes within equivalent meaning and range to those of the claims are encompassed therein.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An atomic oscillator comprising:
a light source;
a gas cell including an internal space in which alkali metal atoms are encapsulated; and
a light detector that detects light which has been emitted from the light source and has passed through the gas cell; wherein
the gas cell includes an incident window through which the light from the light source is incident, an emission window through which the light is emitted to the light detector, and a side wall supporting the incident window and the emission window;
the light incident on the incident window is reduced by the alkali metal atoms encapsulated in the internal space being adhered, in a liquid state or a solid state, to at least the incident window; and
an amount of the alkali metal atoms that are adhered, in the liquid state or the solid state, to the incident window is larger than an amount of the alkali metal atoms that are adhered to the other surfaces.

2. The atomic oscillator according to claim 1, wherein the amount of the alkali metal atoms that are adhered, in the liquid state or the solid state, to the incident window is larger in a central portion than in a peripheral portion.

3. The atomic oscillator according to claim 1, wherein the gas cell reduces, on the incident window, the light from the light source by equal to or more than 40%.

4. The atomic oscillator according to claim 1, wherein a temperature of the incident window is lower than at least a temperature of the emission window.

5. An atomic oscillator comprising:
a light source;
a gas cell including an internal space in which alkali metal atoms are encapsulated; and
a light detector that detects light which has been emitted from the light source and has passed through the gas cell; wherein
the gas cell includes an incident window through which the light from the light source is incident, an emission window through which the light is emitted to the light detector, and a side wall supporting the incident window and the emission window;
the light incident on the incident window is reduced by the alkali metal atoms encapsulated in the internal space being adhered, in a liquid state or a solid state, to at least the incident window; and
the gas cell further includes a first heating portion at a side of the emission window.

6. The atomic oscillator according to claim 1, wherein heat conductivity of the incident window is higher than heat conductivity of the emission window.

7. The atomic oscillator according to claim 1, wherein a thickness of the incident window is smaller than a thickness of the emission window.

8. The atomic oscillator according to claim 1, wherein the incident window includes at least one recess in a central portion of a surface at a side of the internal space.

9. The atomic oscillator according to claim 8, wherein the recess is deeper in a central portion than in a peripheral portion.

10. The atomic oscillator according to claim 1, wherein the gas cell further includes a coating film that reduces or prevents adhesion of the alkali metal atoms in the liquid state or the solid state to a surface of the emission window at a side of the internal space.

11. The atomic oscillator according to claim 10, wherein the gas cell further includes the coating film on a surface of the side wall at a side of the internal space.

12. An electronic apparatus comprising the atomic oscillator according claim 1.

13. The electronic apparatus according to claim 12, wherein the amount of the alkali metal atoms that are adhered, in the liquid state or the solid state, to the incident window is larger in a central portion than in a peripheral portion.

14. The electronic apparatus according to claim 12, wherein the gas cell reduces, on the incident window, the light from the light source by equal to or more than 40%.

15. The electronic apparatus according to claim 12, wherein a temperature of the incident window is lower than at least a temperature of the emission window.

16. The oscillator according to claim 5, wherein an amount of the alkali metal atoms that are adhered, in the liquid state or the solid state, to the incident window is larger than an amount of the alkali metal atoms that are adhered to the other surfaces.

17. The atomic oscillator according to claim 5, wherein the gas cell further includes a second heating portion on the incident window at a side of the side wall.

18. The atomic oscillator according to claim 17, further comprising:
a temperature adjusting portion that adjusts temperatures of the first heating portion and the second heating portion; wherein
the temperature adjusting portion adjusts the temperature of the second heating portion so as to be lower than the temperature of the first heating portion.

19. An atomic oscillator comprising:
a light source;
a gas cell including an internal space in which alkali metal atoms are encapsulated; and
a light detector that detects light which has been emitted from the light source and has passed through the gas cell; wherein
the gas cell includes an incident window through which the light from the light source is incident, an emission window through which the light is emitted to the light detector, and a side wall supporting the incident window and the emission window;
the light incident on the incident window is reduced by the alkali metal atoms encapsulated in the internal space being adhered, in a liquid state or a solid state, to at least the incident window; and
the gas cell further includes a heat dissipating member at a side of the incident window.

20. The atomic oscillator according to claim 19, wherein an amount of the alkali metal atoms that are adhered, in the liquid state or the solid state, to the incident window is larger than an amount of the alkali metal atoms that are adhered to the other surfaces.

* * * * *